United States Patent
Neurauter et al.

(10) Patent No.: US 7,109,762 B2
(45) Date of Patent: Sep. 19, 2006

(54) FREQUENCY-DIVIDING CIRCUIT ARRANGEMENT AND PHASE LOCKED LOOP EMPLOYING SUCH CIRCUIT ARRANGEMENT

(75) Inventors: Burkhard Neurauter, Linz (AT); Markus Scholz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/114,960

(22) Filed: Apr. 26, 2005

(65) Prior Publication Data

US 2005/0258878 A1    Nov. 24, 2005

Related U.S. Application Data

(63) Continuation of application No. PCT/DE03/03423, filed on Oct. 15, 2003.

(30) Foreign Application Priority Data

Nov. 6, 2002    (DE)    ................ 102 51 703

(51) Int. Cl.
*H03K 21/00*    (2006.01)
(52) U.S. Cl. .................... 327/115; 327/117
(58) Field of Classification Search .......... None
See application file for complete search history.

(56) References Cited

U.S. PATENT DOCUMENTS

| | | | |
|---|---|---|---|
| 3,909,791 A | | 9/1975 | Van den Berg |
| 4,016,495 A | * | 4/1977 | Machanian .................. 327/117 |
| 4,575,867 A | * | 3/1986 | Hogue ........................ 377/110 |
| 4,580,282 A | * | 4/1986 | Lawton et al. .............. 377/110 |
| 5,524,035 A | * | 6/1996 | Casal et al. ................. 377/47 |
| 5,754,615 A | * | 5/1998 | Colavin ...................... 377/47 |
| 5,909,144 A | * | 6/1999 | Puckette et al. ............ 327/551 |
| 5,948,046 A | * | 9/1999 | Hagberg ...................... 708/103 |
| 6,570,946 B1 | | 5/2003 | Homol et al. |
| 6,614,274 B1 | * | 9/2003 | Shi et al. .................... 327/115 |
| 6,760,397 B1 | * | 7/2004 | Wu et al. .................... 377/47 |
| 6,842,054 B1 | * | 1/2005 | Wang ........................ 327/115 |
| 2005/0058236 A1 | * | 3/2005 | Ke .............................. 377/49 |

FOREIGN PATENT DOCUMENTS

DE    41 29 657 C2    3/1992

(Continued)

OTHER PUBLICATIONS

"A Family of Low-Power Truly Modular Programmable Dividers in Standard 0.35- μm CMOS Technology," Cicero S. Vaucher, Igor Ferencic, Matthias Locher, Sebastian Sedvalison, Urs Voegeli and Zhenhua Wang, IEEE Journal of Solid-State Circuits, vol. 35, No. 7, Jul. 2000, pp. 1039-1045.

(Continued)

*Primary Examiner*—Timothy P. Callahan
*Assistant Examiner*—Cassandra Cox
(74) *Attorney, Agent, or Firm*—Eschweiler & Associates, LLC

(57) ABSTRACT

A frequency-dividing circuit arrangement is disclosed that includes a divider chain having a plurality of frequency divider stages. The frequency dividers can be changed over between the division ratios 2 and 3. At least that frequency divider that is arranged on the output side of the divider chain has an additional through-switching input that makes it possible to switch through the input signal to the output of the divider stage without influencing the delay-time effects of the divider stage. The advantages of a cascaded 2/3 divider chain, such as a high cut-off frequency, a simple design and the ability to arbitrarily expand, are thus achieved without accepting a lower limit of the range of possible division values.

17 Claims, 2 Drawing Sheets

FOREIGN PATENT DOCUMENTS

| | | |
|---|---|---|
| DE | 695 12 561 T2 | 5/2000 |
| EP | 0 788 237 A1 | 8/1997 |
| WO | WO 99/31805 A1 | 6/1999 |

OTHER PUBLICATIONS

"CMOS High-Speed Dual-Modulus Frequency Divider for RF Frequency Synthesis," Navid Foroudi and Tadeusz A. Kwasniewski, IEEE Journal of Solid-State Circuits, vol. 30, No. 2, Feb. 1995, pp. 93-100.

"A Fully Integrated CMOS DCS-1800 Frequency Synthesizer", Jan Craninckx and Michael S. J. Steyaert, IEEE Journal of Solid-State Circuits, vol. 33, No. 12 Dec. 1998, pp. 2054-2065.

International Search Report, Int'l Application No. PCT/DE03/03423, Int'l Filing Date Oct. 15, 2003, 2 pgs.

\* cited by examiner

FREQUENCY-DIVIDING CIRCUIT ARRANGEMENT AND PHASE LOCKED LOOP EMPLOYING SUCH CIRCUIT ARRANGEMENT

REFERENCE TO RELATED APPLICATIONS

This application is a continuation of PCT/DE03/03423, filed Oct. 15, 2003 which was not published in English, that claims the benefit of the priority date of German Patent Application No. DE 102 51 703.7, filed on Nov. 6, 2002, the contents of which both are herein incorporated by reference in their entireties.

FIELD OF THE INVENTION

The present invention relates to a frequency-dividing circuit arrangement and to a phase locked loop having the frequency-dividing circuit arrangement.

BACKGROUND OF THE INVENTION

Frequency synthesizers are usually provided, for example, in transmitters and receivers for wireless data transmission in order to generate radio-frequency carrier and local oscillator signals. These frequency synthesizers are normally implemented using phase locked loops.

In modern mobile radio, phase locked loops of this type are frequently subject to the requirement that they can cover a large frequency range and at the same time have a small channel separation of, for example, 200 kilohertz.

A frequency divider, which converts the signal frequency provided by an oscillator into a lower signal frequency that is compared with a reference frequency, is normally provided in the feedback path of a phase locked loop for the purpose of channel preselection.

Depending on the application, the frequency dividers which can be used in PLL synthesizers are integer frequency dividers or else those which, on average, divide by fractions.

In the case of so-called dual-modulus frequency dividers, it is possible to change over between two division ratios, one of which has been incremented by the number 1 with respect to the other. Such frequency dividers are also referred to as N/N+1 dividers. Periodically changing over between the two division ratios of the frequency divider results, on average, in the desired, non-integer division ratio.

Dual-modulus frequency dividers of this type can be used to combine the advantages of a high frequency resolution and a short stabilization time.

Frequency dividers of this type are generally also referred to as multimodulus frequency dividers. In this case, provision may be made of a multiplicity of division ratios between which it is possible to change over, for example from 128 to 255.

Since the power consumption in mobile radios such as, for example, mobile telephones or other wireless applications is to be continually reduced as data transmission rates increase, there are a multiplicity of different approaches to designing suitable programmable frequency dividers.

The document N. Foroudi et al. "CMOS High-Speed Dual-Modulus Frequency Divider for RF Frequency Synthesis", IEEE Journal of Solid-State Circuits, Vol. 30, No. 2, February 1995 specifies a programmable divider that uses a dual-modulus prescaler. In this case, the frequency divider can be changed over between the division ratios 3 and 4 in the first frequency divider stage. A :4 frequency divider is connected downstream as a second stage. Overall, the result is a division ratio of 16 or 15 since the division ratio ":3" is only switched on in one of four successive states of the frequency divider.

However, the architecture which has been described and applies to the frequency divider has the disadvantage that it is not possible to achieve a constant delay between the n-th input edge and the divider output edge (triggered as a result) for all values of n.

The document C. S. Vaucher et al. "A Family of Low-Power Truly Modular Programmable Dividers in Standard 0.35-μm CMOS Technology", IEEE Journal of Solid-State Circuits, Vol. 35, No. 7, July 2000 describes a divider architecture that is formed from a multiplicity of :2/:3 frequency divider stages.

Given a number of n divider stages, the range of possible frequency division values m is limited to $2^n \leq m \leq 2^{n+1}-1$ in the implementation described. The smallest division ratio that can be set is also disadvantageously relatively large, particularly in the case of desired high division ratios.

The document J. Craninckx et al. "A Fully Integrated CMOS DCS-1800 Frequency Synthesizer", IEEE Journal of Solid-State Circuits, Vol. 33, No. 12, December 1998 specifies another possible way of designing a programmable frequency divider. In this case, the frequency is actually divided by changing over the signal phases using a prescaler. In this case, the phases are preselected as a function of the desired division ratio. As with the two other approaches explained, the fact that the range of division values which can be set overall undesirably has a lower limit also applies to this approach.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a frequency-dividing circuit arrangement and a phase locked loop having that circuit arrangement, wherein the circuit arrangement provides a division ratio that can be set within a wide range and does not restrict the smallest division value that can be set.

A frequency-dividing circuit arrangement in accordance with the present invention comprises provision of a multiplicity of frequency dividers which respectively have a division ratio that can be changed over between the values 2 and 3 and which each have a signal input, a signal output and a changeover input for preselecting the division ratio of the frequency divider. The frequency dividers are connected to one another in a series circuit in order to form a divider chain, and at least the frequency divider which is arranged on the output side of the divider chain has a through-switching input for preselecting a division ratio (having the value 1) thereof. The arrangement further comprises a feedback path for linking the signal outputs of the frequency dividers to the changeover and through-switching inputs of the frequency dividers. Also included is a decoder circuit having a multiplicity of control outputs which are coupled to the changeover and through-switching inputs of the frequency dividers in order to drive the latter as a function of a desired division value.

In accordance with the proposed invention, the range of possible division values can be arbitrarily extended toward small numbers. By way of example, five 2/3 dividers can thus be connected to two 1/2/3 dividers to form a divider chain. In this case, the particular advantage of the invention resides in the fact that, irrespective of the division ratio that has been set, the N-th input edge (for all values of N) always changes over the same gates, and it is thus ensured that the delay times are always the same. This has a particularly advantageous effect when the divider is used in a phase locked loop.

In the present case, a 2/3 divider is understood as meaning a frequency divider stage which, in a manner such that it can be changed over, either divides the frequency by two, that is to say halves the frequency, or divides the frequency by three.

In addition, a 1/2/3 divider that is provided in accordance with the present invention is additionally provided with a selectable frequency division ratio of one. In comparison with simply switching through the input signal to the output, this has the particular advantage of a constant signal delay time of the frequency divider stage. In this case, the signal delay time of the frequency divider stage is advantageously constant irrespective of whether frequency division by three, by two or by one has been set.

If, as proposed, one or more divider stages are in the form of 1/2/3 frequency dividers, the range of possible division values N is extended to the interval of $2^j \leq N \leq 2^i-1$, where j represents the number of 2/3 frequency divider stages and i represents the total number of 2/3 and 1/2/3 divider stages.

In this case, the lower end of the division value that can be set or the smallest frequency division value that can be set is understood, in the text above and below, as meaning that division ratio which gives rise to the largest output signal frequency that can be set.

In accordance with one embodiment of the present invention, the feedback path has a respective tap node, which is assigned to the frequency divider, for the purpose of tapping off an output signal at a divided-down frequency. In this case, in accordance with the invention, a signal at the frequency of the output signal at the divided-down frequency is preferably available at each tap node.

In one embodiment of the invention, the output of the circuit arrangement, at which the output signal at the divided-down frequency is discharged, is that tap node which is assigned to the input-side frequency divider.

This advantageously results in a delay time that is always constant, over the entire divider chain, between the signal input of the frequency-dividing circuit arrangement, which signal input is formed at the signal input of the input-side frequency divider, and the output of the circuit arrangement. Both the maximum cut-off frequency and the speed of the frequency-dividing circuit arrangement are therefore decoupled from, that is to say independent of, the number of cascaded frequency divider stages and are essentially determined by the first divider stage.

An additional advantage results from the fact that it is possible to simply extend the range of values for the possible division ratios.

In order to form the feedback path, each frequency divider or each frequency divider stage can be assigned an AND gate whose output forms the respective tap node and whose inputs connect, on the one hand, the output of the assigned frequency divider and, on the other hand, the tap node that is assigned to the downstream frequency divider. Consequently, the last frequency divider, that is to say that frequency divider which is arranged on the output side of the divider chain, does not need to be assigned an AND gate.

A respective inverter is, in one example, provided for the purpose of linking the output of the frequency divider stage to the assigned AND gate in the feedback path.

In order to drive the frequency divider using the decoder circuit that provides the desired division value, in one embodiment each frequency divider is assigned a respective further AND gate. The output of the further AND gate is respectively connected to the changeover input of the assigned frequency divider. A first input of the further AND gate is connected to an assigned control output of the decoder device, while the second input is connected to the assigned tap node. The further AND gates therefore drive the changeover inputs of the frequency divider stages as a function of the desired division value and the current output frequencies of the divider stages.

In another embodiment of the invention, a phase locked loop having a circuit arrangement as described above is provided. The phase locked loop comprises a forward path having a phase comparator that drives the input of an oscillator as a function of a comparison between a reference signal and a feedback signal, and a feedback path that couples the output of the oscillator to an input of the phase comparator and comprises the frequency-dividing circuit arrangement.

On account of the high maximum cut-off frequency that is characteristic of the frequency divider described and the division ratio that can be set within a wide range, the circuit arrangement is particularly well suited to implementation in phase locked loops (PLL).

When used in so-called fractional-N PLLs, the use of the multimodulus divider corresponding to the present invention affords the additional advantage that the divider can be programmed to a new division value for each division cycle. When the output signal is tapped off at the tap node that is assigned to the first frequency divider, a constant delay between the N-th input edge and the divider output edge (triggered as a result) results.

On account of the division ratio that can be set within a wide range, the phase locked loop that is designed in accordance with the present invention can cover a large frequency range. In addition, the prerequisites for rapid locking of the phase locked loop to a new frequency and for a high-resolution channel raster are provided in accordance with the invention.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail below using a plurality of exemplary embodiments and with reference to the drawings, in which.

DETAILED DESCRIPTION OF THE INVENTION

Figure 1:
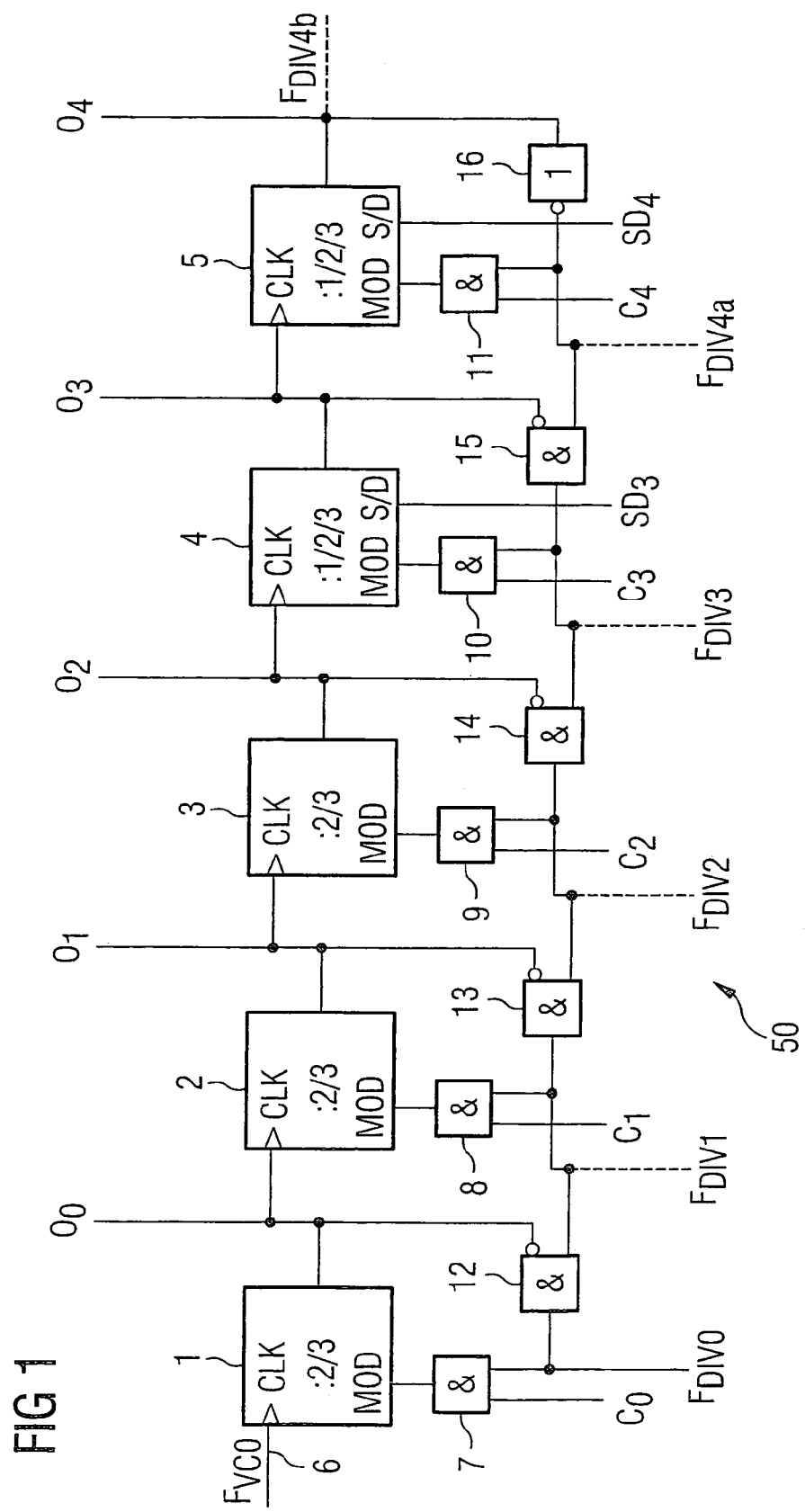
FIG. 1 is a schematic diagram illustrating a frequency-dividing circuit arrangement having five frequency divider stages according to an embodiment of the invention.

FIG. 1 shows a frequency-dividing circuit arrangement 50 in which a series circuit of a plurality of frequency divider stages 1, 2, 3, 4, 5 is provided. Each frequency divider 1 to 5 has a clock input, which serves as a signal input in the present case, a signal output and a changeover input.

The changeover input MOD is used to preselect the frequency division ratio. The frequency division ratio can be changed over between the division values :2 and :3. The two output-side frequency dividers 4, 5 have an additional through-switching input S/D which, when activated, switches through the signal input to the signal output with a constant delay time. The output-side frequency dividers 4, 5 are therefore provided with an additional, selectable frequency division ratio of 1.

The signal input for supplying a signal at a frequency $F_{VCO}$ that is to be divided is provided, in the present case, with reference symbol 6 and is formed at the signal input of the first frequency divider stage 1. The signal output of the first frequency divider stage 1 is connected to the signal input of the second frequency divider stage 2 whose signal output is connected to the signal input of the third frequency divider stage 3, etc. The output of the fifth output-side frequency divider stage 5 is denoted using reference symbol $F_{DIV4b}$.

The signal outputs of the individual frequency divider stages 1 to 5 are additionally routed out of the circuit and are designated $O_0$, $O_1$, $O_2$, $O_3$, $O_4$. The signal outputs of the frequency dividers 1 to 5 are coupled to one another through a feedback path and, in conjunction with the output terminals $C_0$, $C_1$, . . . , $C_4$ of a decoder circuit (not shown) contribute to form the changeover input signals to the respective divider stages.

To this end, the output of a respective AND gate 7, 8, 9, 10, 11 is connected to each changeover input for supplying the frequency divider stages 1 to 5 with a changeover signal MOD. The AND gates 7 to 11 respectively have two inputs. The first input of the AND gates 7 to 11 is respectively connected to one of the input terminals $C_0$ to $C_4$ that connect to a respective control output of a decoder circuit (not shown). The respective second input of the AND gates 7 to 10 is connected to the output of a further AND gate 12, 13, 14, 15. The second input of the AND gate 11 is connected to the output of an inverter 16 whose input is connected to the signal output $F_{DIV4b}$ of the output-side frequency divider 5. The AND gates 12 to 15 also have two inputs each. The respective first input of the AND gates 12 to 15 is in the form of an inverting input and is respectively connected to the output of the assigned frequency divider 1 to 4. The second input of the AND gates 12 to 15 is respectively connected to the output of the AND gate 13 to 15 that is assigned to the downstream frequency divider stage 2 to 5 or, in the case of the gate 15, is connected to the output of the inverter 16. The outputs of the AND gates 12 to 15 and the output of the inverter 16 each form a tap node for tapping off an output signal of the frequency-dividing circuit arrangement, which, in the present case, are designated $FDIV_0$, $FDIV_1$, $FDIV_2$, $FDIV_3$, $FDIV_{4a}$.

In the present case, the signal output $FDIV_0$ is used as the output of the frequency-dividing circuit arrangement 50, at which a signal at a signal frequency that has been divided down with respect to the input signal frequency $F_{VCO}$ can be discharged.

As a result, the present invention makes it possible to accurately specify the delay between the N-th input edge and the divider output edge (triggered as a result) since the output edge is determined by the gate delay times in the first 2/3 divider 1.

The use of the 1/2/3 divider stages 4, 5 advantageously makes it possible to arbitrarily extend the lower limit of the division range (which can be set) of the frequency divider arrangement.

Yet another advantage results from the way in which the individual divider stages 1 to 5 are cascaded in the present example and from the Boolean linking of said divider stages to one another using the AND gates 7 to 15 and the inverter 16 which make it possible to expand the frequency divider arrangement and, in addition, achieve a particularly high cut-off frequency as a result of the signal feedback method presented.

Figure 2:
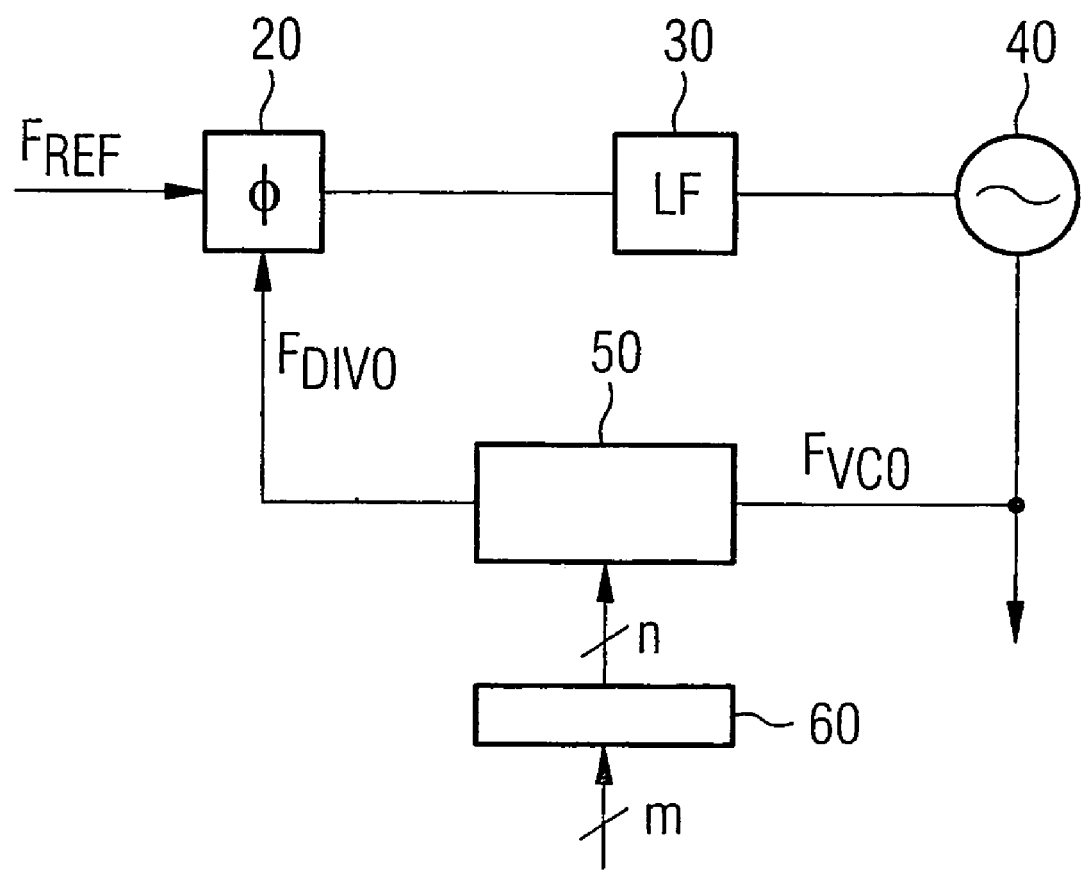
FIG. 2 is a block diagram of a phase locked loop having a frequency divider circuit as shown in FIG. 1 according to another embodiment of the invention.

One possible area of application of the frequency divider arrangement 50 of FIG. 1 is shown in FIG. 2. A block diagram is used there to indicate a phase locked loop (PLL) which comprises a phase comparator 20, a loop filter 30, a controlled oscillator 40, the frequency divider arrangement 50 and a decoder device 60.

The phase comparator 20 has two inputs. A signal at a reference frequency $F_{REF}$ is supplied to a first input. A controlled oscillator 40 is connected to the output of the phase comparator 20 via a loop filter 30. Said oscillator provides a signal at an oscillator frequency $F_{VCO}$ at its output and, at the same time, represents the output terminal of the phase locked loop. Connected to the latter is the input of the frequency divider arrangement 50 whose output $F_{DIV0}$ is connected to the second input of the phase comparator 20.

The output signal at the divided-down frequency is output at the output of the frequency divider arrangement 50. In order to drive the individual frequency divider stages 1 to 5 of the frequency divider arrangement 50, the decoder device 60 is connected to the frequency divider arrangement 50 via a multiplicity of control lines which are connected to control outputs of the decoder 60. A channel word containing information about the desired oscillator frequency can be supplied to a control input of the decoder device 60.

The fractional-N PLL shown in FIG. 2 and having a multimodulus divider 50 as shown in FIG. 1 can advantageously cover a very large division range. As already explained with reference to FIG. 1, the frequency divider 50 provides a constant delay between the N-th input edge and the divider output edge that is associated with the latter.

It goes without saying that, depending on the desired frequency division range that can be set, it is also within the scope of the present invention to provide more or fewer divider stages (than shown in FIG. 1) having a division ratio of 1 in the frequency divider arrangement.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A frequency-dividing circuit arrangement, comprising:
a plurality of serially coupled frequency divider components each respectively having a selectively changeable division ratio changeable between the values two (2) and three (3), and which each have a signal input, a signal output and a changeover input, wherein the changeover input is configured to preselect the division ratio of the respective frequency divider component, the serially coupled frequency divider components forming a divider chain;
wherein at least the last frequency divider component arranged at an output side of the divider chain further comprises a through-switching input configured to preselect a division ratio having the value one (1) for the last frequency divider component;
the divider chain further comprising a feedback path linking the signal outputs of the frequency divider components to the changeover inputs of the frequency divider components, respectively; and
a decoder circuit comprising a plurality of control outputs that are coupled to the changeover and through-switching inputs of the frequency dividers, respectively, wherein the control outputs are configured to drive the respective components as a function of a desired division value.

2. The circuit arrangement of claim 1, wherein the feedback path has a respective tap node associated with a respective frequency divider component, and configured to tap off an output signal at a divided-down frequency.

3. The circuit arrangement of claim 2, wherein the tap node associated with a first frequency divider component of the divider chain is the output of the circuit arrangement.

4. The circuit arrangement of claim 2, the feedback path further comprising for each frequency divider component a respective AND gate having an output forming the respective tap node of the respective component, wherein the AND gate links the output of the respective frequency divider component to the tap node that is assigned to a downstream frequency divider component.

5. The circuit arrangement of claim 4, further comprising an inverter configured to link the output of each frequency divider component to the respective AND gate.

6. The circuit arrangement of claim 2, further comprising for each frequency divider component a respective AND gate having a respective output connected to the changeover input of the respective frequency divider component having a first input of the AND gate connected to an assigned control output of the decoder circuit, and having a second input of the AND gate connected to the respective tap node associated with the respective frequency divider component.

7. A phase locked loop, comprising:
a forward path comprising a phase comparator and an oscillator, wherein the phase comparator is configured to drive an input of the oscillator as a function of a comparison between a reference signal and a feedback signal; and
a feedback path that couples an output of the oscillator to an input of the phase comparator, the feedback path comprising a frequency-dividing circuit arrangement, comprising:
a plurality of serially coupled frequency divider components each respectively having a selectively changeable division ratio, and which each have a signal input, a signal output and a changeover input, wherein the changeover input is configured to preselect the division ratio of the respective frequency divider component, the serially coupled frequency divider components forming a divider chain;
wherein at least the last frequency divider component arranged at an output side of the divider chain further comprises a through-switching input configured to preselect a division ratio having the value one (1) for the last frequency divider component; and
the divider chain further comprising a feedback path linking the signal outputs of the frequency divider components to the changeover inputs of the frequency divider components, respectively.

8. The phase locked loop of claim 7, the frequency-dividing arrangement further comprising a decoder circuit comprising a plurality of control outputs that are coupled to the changeover and through-switching inputs of the frequency dividers, respectively, wherein the control outputs are configured to drive the respective components as a function of a desired division value.

9. A phase locked loop circuit, comprising:
a comparator circuit configured to compare a reference signal and a divided feedback signal and generate a control signal in response thereto;
an oscillator circuit configured to generate a feedback signal as a function of the control signal from the comparator circuit; and
a frequency divider circuit configured to receive the feedback signal and divide down the feedback signal by a programmable divider ratio to generate the divided feedback signal, the frequency divider circuit comprising:
a plurality of serially coupled frequency divider components forming a divider chain, each divider component comprising an input, an output, and a changeover input, wherein each of the divider components are configured to divide a signal at the input by one of a plurality of different divider ratios based on a state of the respective changeover input, and provide the divided signal at the output thereof;
wherein at least a last frequency divider component in the divider chain further comprises a through-switching input, and wherein the last divider component is further configured to force a divider ratio to unity based on a state of the through-switching input.

10. The phase locked loop circuit of claim 9, wherein the divider ratios of each of the divider components is two and three, respectively.

11. The phase locked loop circuit of claim 9, wherein the frequency divider circuit further comprises a decoder circuit configured to drive the changeover inputs of the frequency divider components based on a desired divider ratio for the frequency divider circuit.

12. The phase locked loop circuit of claim 11, wherein the decoder circuit is further configured to drive the through-switching input of the last frequency divider component based on the desired divider ratio for the frequency divider circuit.

13. The phase locked loop circuit of claim 9, wherein each frequency divider component further comprises a feedback path having a respective tap node associated therewith, and configured to tap off an output signal at a divided-down frequency.

14. The phase locked loop circuit of claim 13, wherein the tap node associated with a first frequency divider component of the divider chain is the output of the frequency divider circuit.

15. The phase locked loop circuit of claim 13, the feedback path further comprising for each frequency divider component a respective AND gate having an output forming the respective tap node of the respective component, wherein the AND gate links the output of the respective frequency divider component to the tap node that is assigned to a downstream frequency divider component.

16. The phase locked loop circuit of claim 15, further comprising an inverter configured to link the output of each frequency divider component to the respective AND gate.

17. The phase locked loop circuit of claim 13, further comprising for each frequency divider component a respective AND gate having a respective output connected to the changeover input of the respective frequency divider component having a first input of the AND gate connected to an assigned control output of the decoder circuit, and having a second input of the AND gate connected to the respective tap node associated with the respective frequency divider component.

* * * * *